(12) United States Patent
Zhou

(10) Patent No.: US 8,083,380 B2
(45) Date of Patent: Dec. 27, 2011

(54) INTEGRATED STRUCTURE FOR OPTICAL REFRACTOR

(75) Inventor: Jian-Lin Zhou, Dong-guan (CN)

(73) Assignee: MIG Technology Inc., Taipei (TW)

( * ) Notice: Subject to any disclaimer, the term of this patent is extended or adjusted under 35 U.S.C. 154(b) by 241 days.

(21) Appl. No.: 12/425,950

(22) Filed: Apr. 17, 2009

(65) Prior Publication Data

US 2010/0265721 A1    Oct. 21, 2010

(51) Int. Cl.
*F21V 3/00*     (2006.01)
*F21V 5/00*     (2006.01)

(52) U.S. Cl. .............. 362/311.02; 362/311.14; 362/338; 362/374; 362/375; 257/98; 257/99

(58) Field of Classification Search .................... 257/98, 257/99; 362/311.01, 311.02, 311.1, 311.14, 362/311.15, 335, 338, 374, 375
See application file for complete search history.

(56) References Cited

U.S. PATENT DOCUMENTS

| | | | |
|---|---|---|---|
| 7,857,497 B2 * | 12/2010 | Koike et al. | 362/335 |
| 7,872,278 B2 * | 1/2011 | Stoyan | 257/98 |
| 2010/0073907 A1 * | 3/2010 | Wanninger et al. | 362/311.02 |

* cited by examiner

*Primary Examiner* — Stephen F Husar

(57) ABSTRACT

The present invention relates to an integrated structure for an optical refractor, and more particularly to an integrated structure between a circuit board and an optical refractor which enables exposing the light source after dismantling to facilitate replacement and maintenance thereof. The integrated structure is composed of a planar baseplate, centrally integrated with an optical refractor lens, and the bottom surface of the baseplate is provided with a male end clasping portion parallel to the incident light surface, the male end clasping portion being further provided with position fixing tenons used for fixing position and clasp pins used for clasping, thereby enabling convenient disassembly and replacement to facilitate exposing the light emitting crystal on the front surface of the circuit board to enable maintenance and replacement.

10 Claims, 5 Drawing Sheets

INTEGRATED STRUCTURE FOR OPTICAL REFRACTOR

BACKGROUND OF THE INVENTION (a) Field of the Invention

The present invention provides an integrated structure for an optical refractor, and more particularly provides an integrated structure between a circuit board and an optical refractor which enables dismantling the optical refractor to expose the light emitting crystal for replacement and maintenance thereof, and facilitates replacing the optical refractor and light emitting crystal to accommodate requirements for different index of refraction or wavelength.

(b) Description of the Prior Art

An optical refractor joined to a diode light source enables changing the light shape or illumination angle; moreover, in order to avoid diffraction loss caused by air molecules, the light emitting crystal is necessarily mounted close to the incident light surface of the optical refractor. Hence, it is often seen that a convex lens is attached close to the light-emitting surface of the light emitting crystal to enable divergence of the light beam, or a diffusion interference layer is further fitted to more evenly diffuse the light beam.

Bonding means is commonly used to join the refractor to the light-emitting surface of the light emitting crystal, wherein the bonding means first joins the light emitting crystal to the surface of a circuit board, then the optic axis of a convex lens is aligned with the light emitting crystal light source, and an adhesive agent is used between the convex lens and the circuit board to join the two together, thereby forming a normal fixed type. When the light emitting crystal malfunctions, then the light emitting crystal must be gouged out in order to implement removal and replacement thereof. However, using such gouging means damages the surface of the circuit board, even the electric circuit, and implementation of such means is difficult. Furthermore, such an illumination apparatus is often seen fitted in ceilings or at relatively high positions, and thus maintenance must be carried out high above the ground, making operational implementation even more difficult. In addition, the optical refraction lens is directly joined to the surface of the light emitting crystal using a method to single body molding method. However, such joining means is unable to realize free replacement and modulation of light beam emission angle and wavelength, and the entire apparatus must be dismantled when the crystal malfunctions.

SUMMARY OF THE INVENTION

A primary objective of the present invention, taking into consideration convenient maintenance and free replacement of a light emitting crystal and modulation of the wavelength and refraction angle, uses an optical refractor provided with a male end clasping portion, and uses the male end clasping portion to enable dry operational clasping to achieve easy assembly and disassembly, and enable free replacement to provide different optical specifications.

Another objective of the present invention is to further provide the male end clasping portion with position fixing tenons to ensure retention of the optical center.

A third objective of the present invention is to provide operational admittance openings corresponding to positions of clasp pins of the male end clasping portion, thereby enabling a tool to penetrate and disengage the clasp pins to facilitate disassembling an optical refractor.

To enable a further understanding of said objectives and the technological methods of the invention herein, a brief description of the drawings is provided below followed by a detailed description of the preferred embodiments.

DETAILED DESCRIPTION OF THE PREFERRED EMBODIMENTS

The present invention provides an integrated structure for an optical refractor, and more particularly provides an integrated structure for an optical refractor which allows exposure of crystals on a circuit board for replacement and repair, and enables free replacement to provide different specifications according to requirements for different index of refraction or wavelength.

Figure 1:
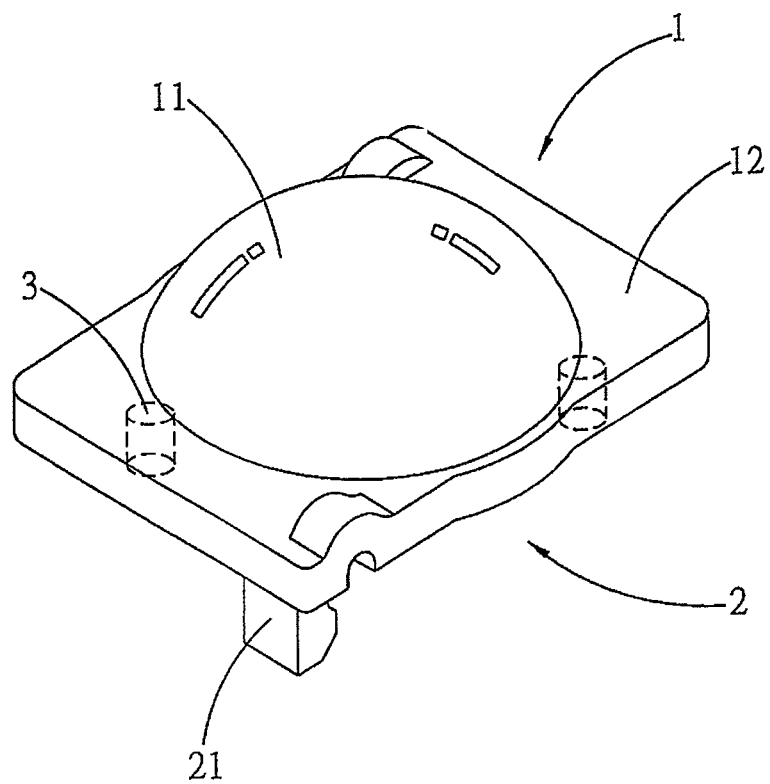
FIG. 1 is an elevational external perspective view of the present invention.
Figure 2:
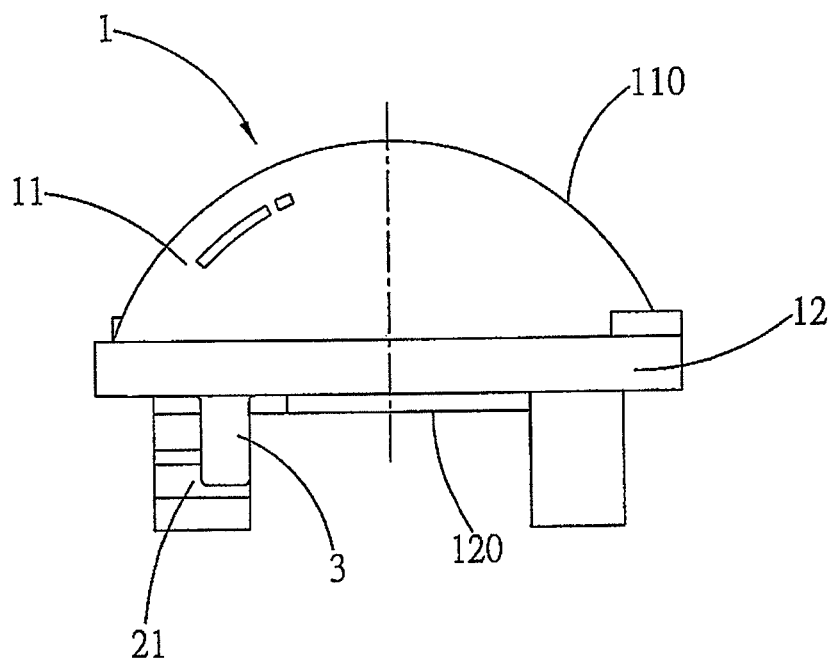
FIG. 2 is a side view of FIG. 1.
Figure 3:
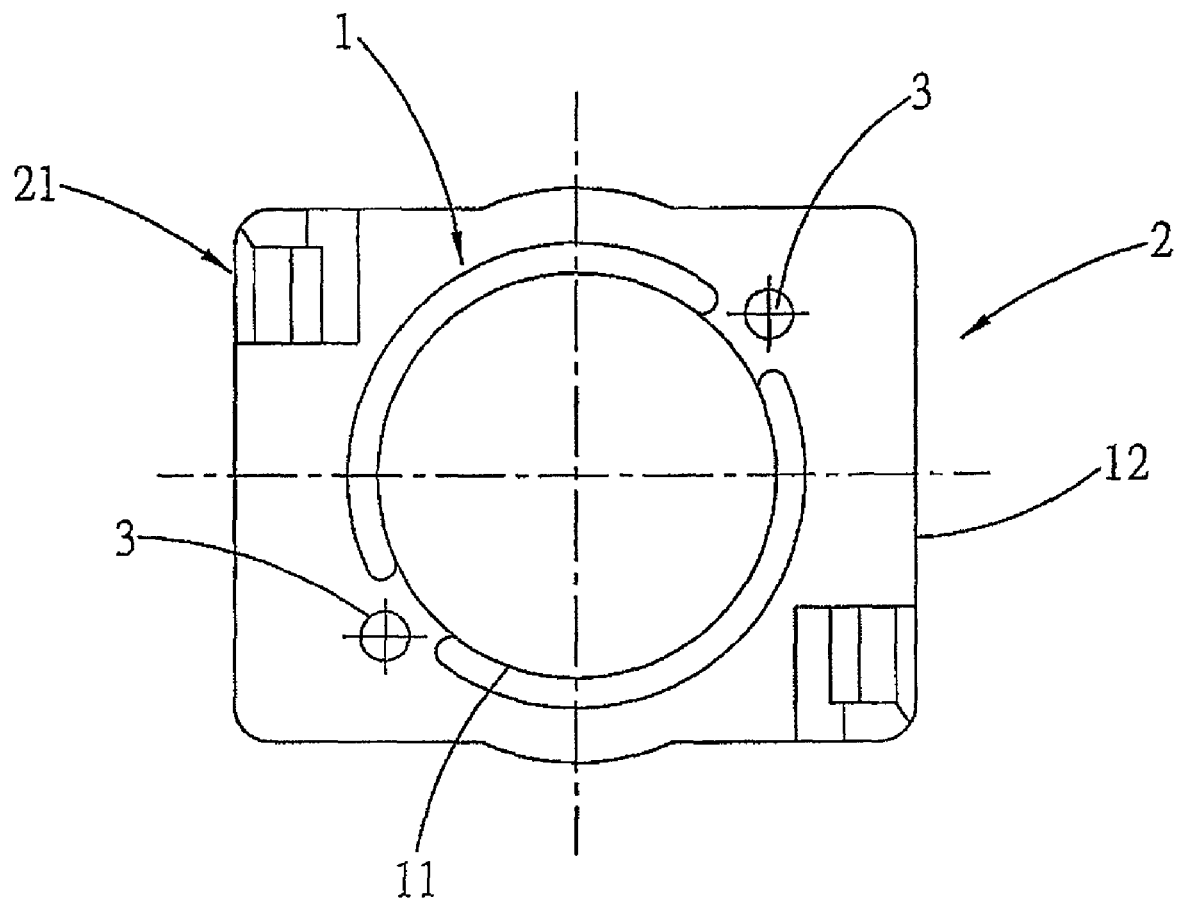
FIG. 3 is a top view of FIG. 1.

Regarding the structure and operational principle of the present invention, referring first to FIGS. 1~3, wherein an optical refractor 1 comprises a tabular baseplate 12, an optical refractor lens 11 pointing upward and joined to the baseplate 12, and a male end clasping portion 2 formed facing downward therefrom. The entire body can be achieved using a combination method or formed using a single body injection method, wherein an incident light surface 120 is provided at the bottom portion of the baseplate 12 corresponding to position of the axis center of optical paths, thereby enabling a light beam n entering through the incident light surface 120 to pass through the optical refractor lens 11 and emerge from the surface of an optical curved surface 110.

The male end clasping portion 2 comprises clasp pins 21 and position fixing tenons 3, wherein the clasp pins 21 form a clasping function which enable joining to a corresponding circuit board. The position fixing tenons 3 are used to fix position, the position fixing objective being to enable the optics axis center obtain the correct corresponding position. It can be seen from FIG. 3 that the clasp pins 21 and the position fixing tenons 3 are in a symmetrical configuration, and, moreover, enable opening the working range of the optical refractor lens 11. If the baseplate 12 and the optical refractor lens 11 are made from transparent material or formed from a single body, then the entire body forms a perspective form, wherein the column shafts of the position fixing tenons 3 can be shaped as columnar forms with tapered sides (not shown in the drawings), thereby providing the effectiveness to realize center line alignment.

Figure 4:
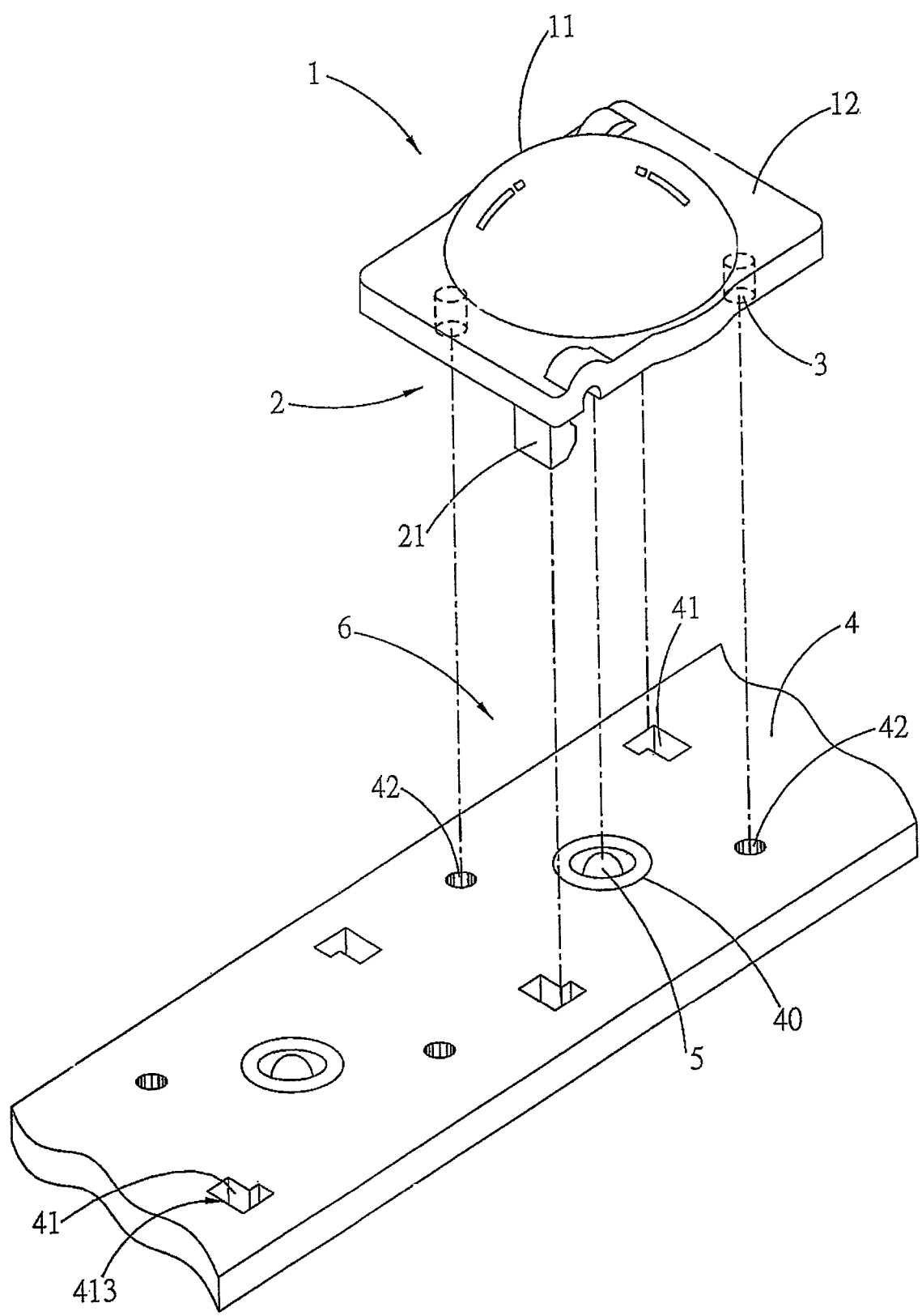
FIG. 4 is a schematic relationship view of the present invention assembled to a circuit board.

Regarding the relationship between the male end clasping portion 2 fitted to the optical refractor 1 and joining to a circuit board 4, referring to FIG. 4, wherein the optical refractor 1 is provided with the baseplate 12, the under portion of which is provided with the male end clasping portion 2, and the clasp pins 21 and the position fixing tenons 3 are separately disposed on the male end clasping portion 2. More than two of the position fixing tenons 3 can be disposed in alignment on the male end clasping portion 2, thereby enabling the flat surface of the baseplate 12 to obtain planar angular positioning when mounted, whereupon the clasp pins 21 are able to produce a clasping force, enabling movable assembling and disassembling from the circuit board 4.

The circuit board 4 is provided with a female end clasping portion 6 corresponding to the position of each component of the male end clasping portion 2, and the female end clasping portion 6 is formed from locating holes 42 and clasp fastening holes 41, and a through hole 40, enabling a light emitting crystal 5 to be installed therein, is defined central of the locating holes 42 and the clasp fastening holes 41, moreover, the through hole 40 enables the optical working axis of the optical refractor lens 11 to be located central of the light emitting crystal 5 after assembling thereof.

Figure 5:
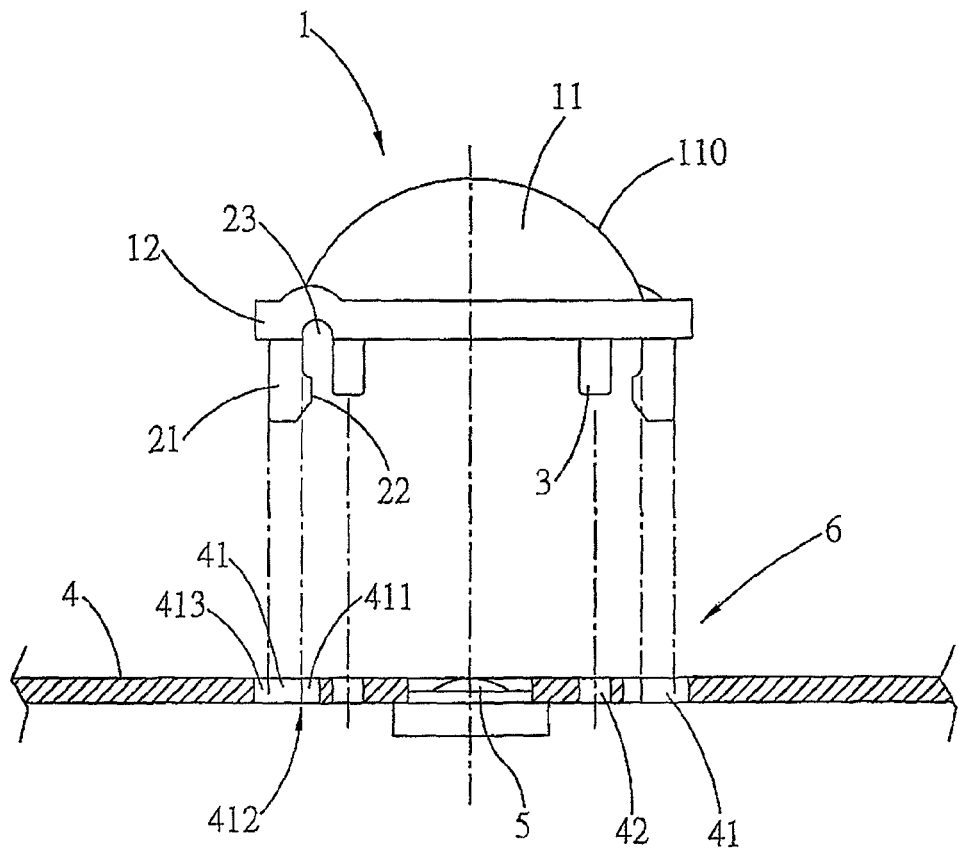
FIG. 5 is a test relationship view of FIG. 4.
Figure 6:
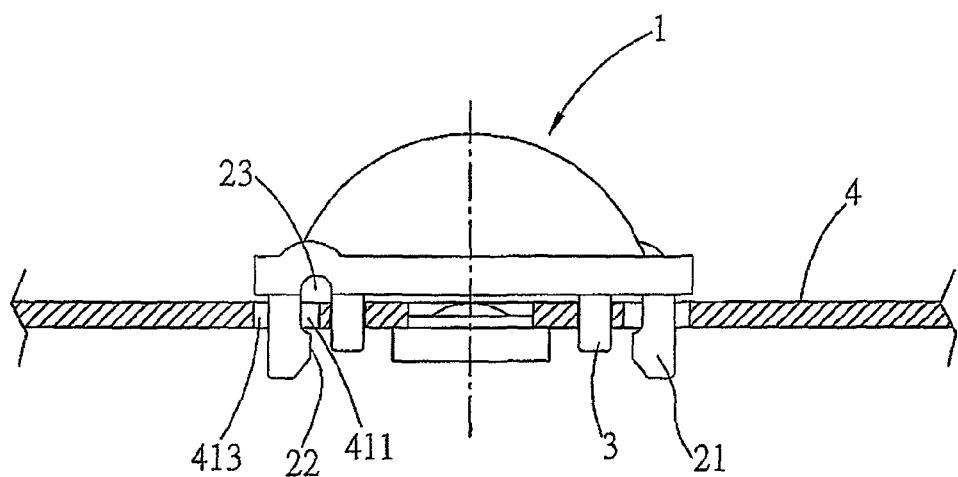
FIG. 6 is a test relationship view of FIG. 4 after assembly.

Because of elastic movement provided between the clasp pins 21 and the clasp fastening holes 41, thus, a clearance 413 is provided between the rear surface of each of the clasp pins 21 and side surface of each of the clasp fastening holes 41 (as depicted in FIG. 5 and FIG. 6) to enable the clasp pins 21 to penetrate the respective clasp fastening holes 41 when elastic deformation thereof occurs. Accordingly, fitting of the joint between the clasp pins 21 with the clasp fastening holes 41 is not exact after mutual clasping thereof. Hence, using functionality of the position fixing tenons 3 to correspondingly mount into the respective locating holes 42 enables obtaining planar positioning, moreover, using more than two of the position fixing tenons 3 achieves rectilinear synergistic reinforcement on the baseplate 12 area and obtains planar positioning thereon to enable the optic axis of the optical refractor lens 11 to be effectively located at the stimulated light center point of the light emitting crystal 5.

The circuit board 4 can be mounted with a plurality of the light emitting crystals 5, and the peripheries of the plurality of light emitting crystals 5 are similarly correspondingly provided with the locating holes 42 and the clasp fastening holes 41, and the plurality of light emitting crystal 5 can be arranged to form a sequential configuration or a matrix or an array, in which each of the light emitting crystals 5 is mounted to the corresponding optical refractor 1.

Referring again to FIG. 5, an admittance hole 23 is defined in the plate of the baseplate 12 in correlation to the upper side position of each of the clasp pins 21. The admittance holes 23 enable any thin rod-shaped tool (not shown in the drawing) to enter and directly touch and move the clasp pins 21 from the exterior of the optical refractor 1, thereby causing a protruding clasp 22 of the clasp pin 21 to separate from a clasp end 412 of the clasp fastening hole 41. Existence of the admittance holes 23 can be used to enable the optical refractor 1 to be easily pulled out and disassembled, thereby returning the surface of the circuit board 4 to an exposed state to facilitate maintenance of the light emitting crystal 5. In particular, under circumstances whereby the rear surface (interior) of the circuit board 4 is an encapsulated body, and the light emitting crystal 5 can only enter from the front surface (exterior surface), then existence of the admittance holes 23 are especially needed to enable disassembly and assembly operations to be carried out on the optical refractor 1 from the exterior.

A local admittance opening 411 enabling partial opening is formed in the clasp fastening holes 41 of the female end clasping portion 6 provided on the circuit board 4 corresponding to the linear run-through position of the respective admittance holes 23 defined in the baseplate 12. An operational passageway is thus formed in the run-through between each of the local admittance openings 411 and the admittance hole 23, enabling a long thin rod-shaped tool (not shown in the drawings) to enter from the exterior and directly contact the protruding clasp 22 of the clasp pin 21, thereby enabling the tool to effect a pushing action on the surface of the protruding clasp 22, which causes the protruding clasp 22 to draw back from the position of the clasp end 412, thus enabling the entire clasp pin 21 to unclasp and push upward the optical refractor 1 to realize separation thereof.

Using the aforementioned method enables achieving disassembly and assembly of the optical refractor 1, which apart from enabling convenient maintenance of the light emitting crystal 5, moreover, requirements for different curvatures of the optical curved surface 110 configured on the optical refractor lens 11 of the optical refractor 1 and replacement with different optical refractors 1, or providing the optical refractor 1 with different wavelength interference, then the optical refractor 1 having different ability to refract wavelengths can be replaced exterior of the light emitting crystal 5 having fixed wavelength, thereby facilitating modulation of the light wavelength or variational replacement of refractive curvature to enable use in occasions requiring change in size of the light projection area or occasions requiring change in the wavelength. In particular, under circumstances when a single illuminating apparatus is assembled from a plurality of LEDs (light-emitting diodes), in which modulation of partial index of refraction or wavelength will both affect change in the light shape or wavelength of the illuminating apparatus, thus, replacement is able to meet actual requirements.

Regarding the clasp relationship between the optical refractor 1 and the circuit board 4 after assembly, referring to FIG. 6, the circuit board 4 enables the clasp pins 21 and the position fixing tenons 3 fitted to the optical refractor 1 to clasp and fix position thereon, and a run-through configuration is formed between each of the admittance holes 23 and the local admittance openings 411 of the optical refractor 1 and the circuit board 4 respectively. Accordingly, the user is able to use the admittance holes 23 to serve as access openings, and after penetrating the local admittance openings 411, as depicted in FIG. 5, the protruding clasps 22 are actuated, whereupon elastic displacement causes the protruding clasps 22 to move back, thereby enabling the optical refractor 1 to be separated from the circuit board 4.

Figure 7:
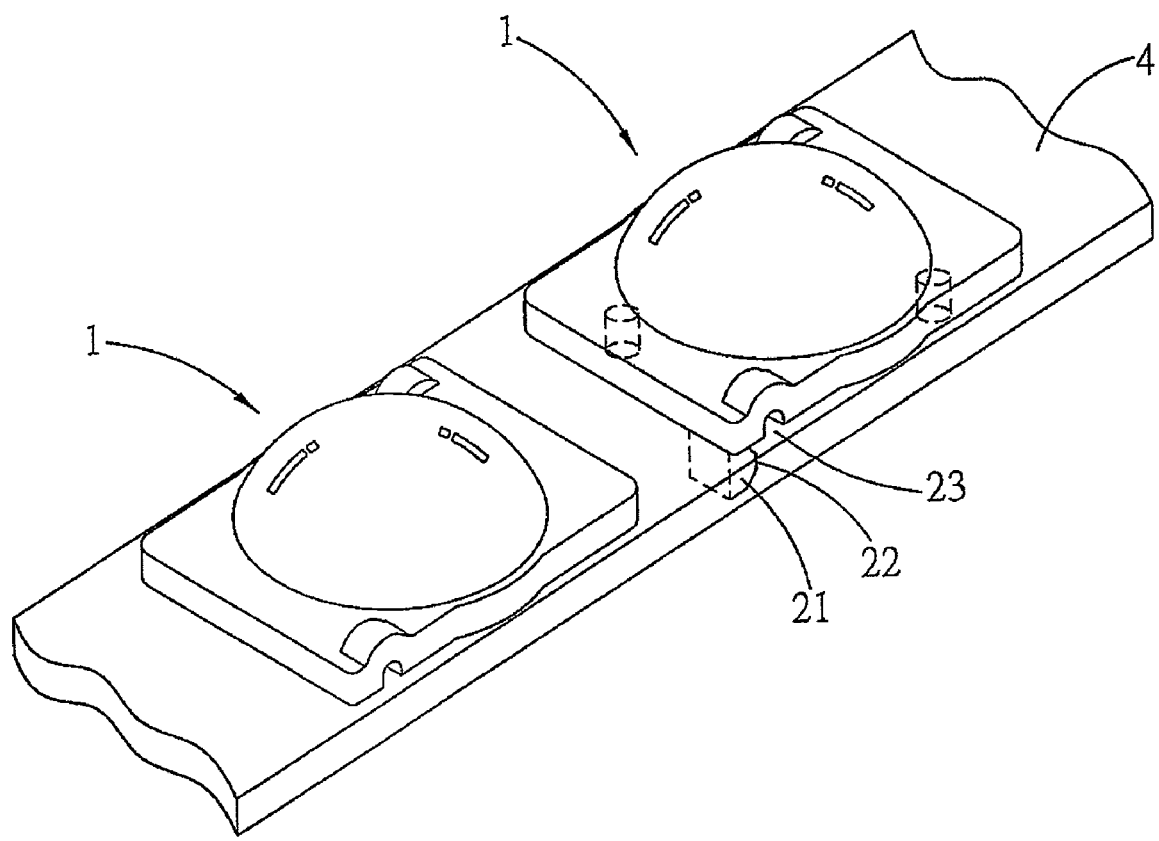
FIG. 7 is an, elevational external view of FIG. 4 after assembly.

Referring to FIG. 7, wherein the drawing depicts an assembled schematic view after a plurality of the optical refractors 1 have been sequentially installed on the circuit board 4, and the admittances hole 23 defined in the optical refractor 1 are able to form operating spaces to enable a long thin tool (not shown in the drawings) to move the protruding clasps 22 fitted on the clasp pins 21 and draw back from the fixed clasping of the circuit board 4.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. An integrated structure for optical refractor, wherein the integrated structure for optical refractor is attached to the exterior of a light emitting crystal, and, after removing, enables replacement and maintenance of the light emitting crystal from a front side of the integrated structure, the integrated structure comprising:

a baseplate, to an upper portion of which an optical refractor lens provided with an optic axis is joined, wherein one side of the baseplate is provided with an incident light surface of the optical refractor, and the incident light surface is perpendicular to an optic axis of the optical refractor;

a male end clasping portion joined to the baseplate, the male end clasping portion further comprising: a set of position fixing tenons and a set of clasp pins;

a circuit board, wherein the circuit board enables a light emitting crystal to be installed thereon, and is provided with a female end clasping portion around a periphery of the light emitting crystal, the female end clasping portion comprises locating holes and clasp fastening holes, the clasp pins are elastically engaged in the clasp fastening holes, and the position fixing tenons are engaged in the locating holes;

wherein admittance holes are defined in the baseplate, and local admittance openings are respectively extended from the clasp fastening holes and are in run-through alignment with the admittance holes respectively.

2. The integrated structure for optical refractor according to claim 1, wherein the position fixing tenons are columnar shaped.

3. The integrated structure for optical refractor according to claim 1, wherein there are two of the position fixing tenons.

4. The integrated structure for optical refractor according to claim 1, wherein the male end clasping portion is located underneath the baseplate.

5. The integrated structure for optical refractor according to claim 1, wherein a protruding clasp is formed on each of the clasp pins and at a side of the corresponding clasp pin facing the local admittance opening.

6. The integrated structure for optical refractor according to claim 5, wherein a clearance is defined between each of the clasp pins and the corresponding clasp fastening hole to allow the clasp pins elastically engaged in or disengaged from the clasp fastening holes.

7. An integrated structure for optical refractor comprising:

a circuit board having a light emitting crystal installed thereon, wherein a set of clasp fastening holes and a set of locating holes are defined in the circuit board and located around the light emitting crystal; and a baseplate having an optical refractor lens which is located over the light emitting crystal, and a set of clasp pins and a set of position fixing tenons, wherein the clasp pins are elastically engaged in the clasp fastening holes and the position fixing tenons are engaged in the locating holes;

wherein the baseplate defines admittance holes adjacent to the clasp pins respectively, and the circuit board defines local admittance openings in communication with the clasp fastening holes respectively and in run-through alignment with the admittance holes respectively.

8. The integrated structure according to claim 7, wherein a protruding clasp is formed on each of the clasp pins and at a side of the corresponding clasp pin facing the local admittance opening.

9. The integrated structure for optical refractor according to claim 8, wherein a clearance is defined between each of the clasp pins and the corresponding clasp fastening hole to allow the clasp pins elastically engaged in or disengaged from the clasp fastening holes.

10. The integrated structure according to claim 7, wherein the locating holes are closer to the light emitting crystal comparing with the clasp fastening holes.

* * * * *